(12) United States Patent
Marshall

(10) Patent No.: US 7,319,357 B2
(45) Date of Patent: Jan. 15, 2008

(54) SYSTEM FOR CONTROLLING SWITCH TRANSISTOR PERFORMANCE

(75) Inventor: Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 133 days.

(21) Appl. No.: 10/925,242

(22) Filed: Aug. 24, 2004

(65) Prior Publication Data

US 2006/0044043 A1    Mar. 2, 2006

(51) Int. Cl.
*H03K 3/01* (2006.01)
(52) U.S. Cl. .................. 327/534; 327/537
(58) Field of Classification Search .............. 327/108, 327/122, 376, 377, 379, 389, 391, 427, 428, 327/434, 534, 537, 544
See application file for complete search history.

(56) References Cited

U.S. PATENT DOCUMENTS

| | | | | |
|---|---|---|---|---|
| 5,821,769 A | * | 10/1998 | Douseki | 326/34 |
| 5,986,947 A | * | 11/1999 | Choi et al. | 365/189.11 |
| 6,043,536 A | * | 3/2000 | Numata et al. | 257/347 |
| 6,097,113 A | * | 8/2000 | Teraoka et al. | 307/125 |
| 6,118,328 A | * | 9/2000 | Morikawa | 327/534 |
| 6,400,209 B1 | * | 6/2002 | Matsuyama et al. | 327/534 |
| 6,465,849 B1 | * | 10/2002 | Chang et al. | 257/369 |
| 6,515,534 B2 | * | 2/2003 | Dabral | 327/534 |
| 6,744,301 B1 | * | 6/2004 | Tschanz et al. | 327/534 |
| 6,885,234 B2 | * | 4/2005 | Ando | 327/534 |
| 7,123,076 B2 | * | 10/2006 | Hatakeyama et al. | 327/534 |
| 2004/0021501 A1 | * | 2/2004 | Das et al. | 327/534 |
| 2004/0183585 A1 | * | 9/2004 | Mizuno et al. | 327/534 |
| 2004/0251484 A1 | * | 12/2004 | Miyazaki et al. | 257/299 |
| 2005/0162211 A1 | * | 7/2005 | Ryu et al. | 327/530 |
| 2006/0022733 A1 | * | 2/2006 | Nair | 327/210 |

* cited by examiner

*Primary Examiner*—Kenneth B. Wells
*Assistant Examiner*—Thomas J. Hiltunen
(74) *Attorney, Agent, or Firm*—Rose Alyssa Keagy; W. James Brady; Freerick J. Telecky, Jr.

(57) ABSTRACT

The present invention provides a system for controlling performance of a switch transistor (106)—one that is implemented within a circuitry segment (100) to shut off a circuitry component (116) when that component is not in use. The switch transistor has a first terminal coupled to a first supply voltage (102), a second terminal coupled to an internal voltage rail (108), a gate coupled to an activation signal source (110), and a body coupled to a bias signal source (114). A bias signal, sufficient to induce a negative body bias across the switch transistor, is applied by the bias signal source when that transistor is shut off. A bias signal, sufficient to induce a negative body bias across the switch transistor, is applied by the bias signal source for a period of time following assertion of an activation signal from the activation signal source that turns the switch transistor on. A bias signal, sufficient to induce a positive body bias across the switch transistor, is applied by the bias signal source after the period of time.

19 Claims, 1 Drawing Sheet

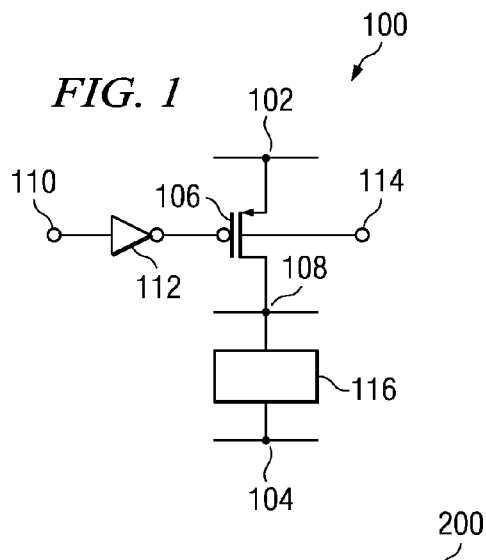
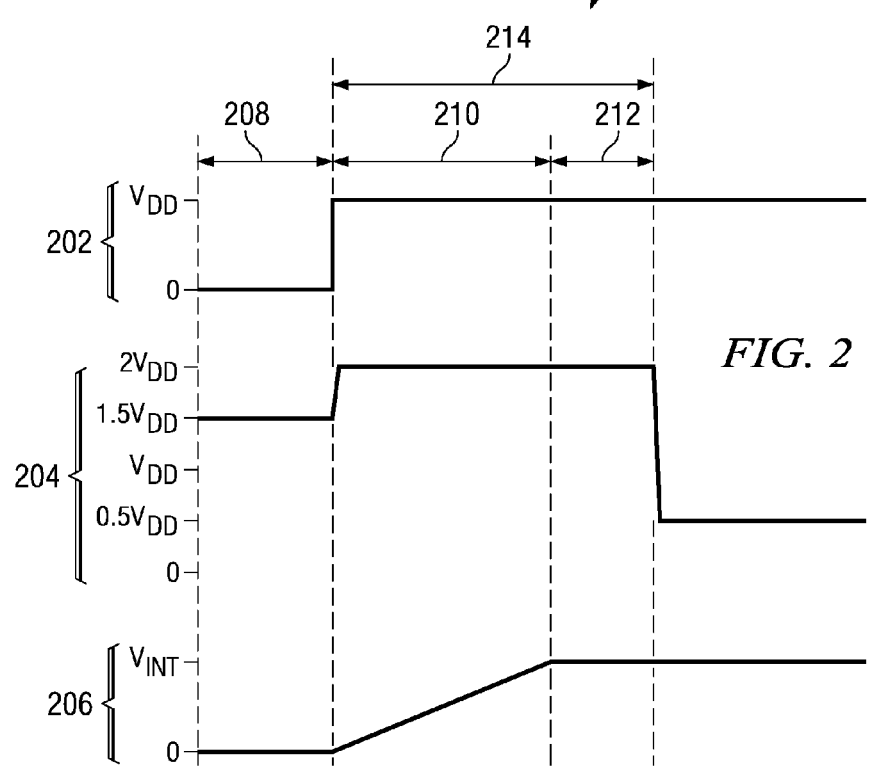
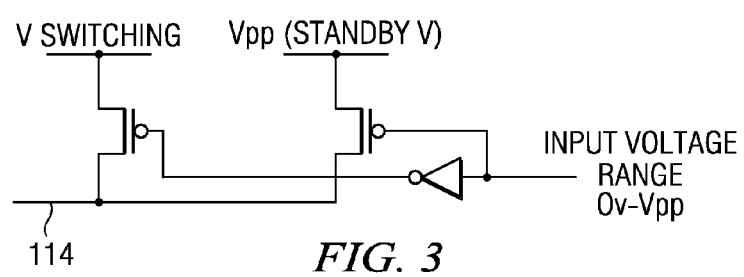

SYSTEM FOR CONTROLLING SWITCH TRANSISTOR PERFORMANCE

TECHNICAL FIELD OF THE INVENTION

The present invention relates generally to the field of semiconductor devices and, more particularly, to apparatus and methods for controlling switch timing and drive strength of a semiconductor transistor switch.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor device properties and behaviors.

The increased packing density of the integrated circuit generates numerous challenges to the semiconductor manufacturing process. Every device must be smaller without damaging the operating characteristics of the integrated circuit devices. High packing density, low heat generation, low power consumption, and good reliability must be maintained while satisfying a number of critical performance parameters.

Commonly, system designers specify or define a number of required operational parameters (e.g., max/min voltage, signal timing) for certain circuitry segments in a system. Semiconductor devices (i.e., integrated circuits) must comply with such required parameters in order to be used in the system. For example, a system may require that a semiconductor device operate over supply voltage range of 0V to 1.2V or, in another example, a system may require that a semiconductor device provide specified timing parameters (e.g., $t_{rise(MIN)}$, $t_{fall(MAX)}$) on a particular signal.

Unfortunately, there are a large number of variables in semiconductor device manufacturing that can affect any given performance parameter. Intra-process variations, feature matching issues, and layout considerations are among a number of concerns that impact a device manufacturer's ability to provide a specified performance parameter. One common concern, especially in low-voltage, small-geometry transistor technologies, involves the issue of leakage current and problems associated therewith.

Increasingly, small-geometry transistors have proportionally higher off state leakage currents than similar large-geometry transistor technologies. Relatively high off state transistor leakage currents, and corresponding power consumption, can have a significant negative impact in a number of low-voltage applications. Consider, for example, a mobile phone or a PDA that relies on battery power. High transistor leakage current levels can cause circuitry within such a device, even when not in use, to drain battery power very rapidly. This, of course, presents a number of problems for the user, the end-equipment manufacturer, and the semiconductor device manufacturer. A number of efforts have, therefore, been made in an attempt to control or limit transistor leakage currents—especially in the off state.

In many applications, for example, a small switch transistor is employed, in either a header switch or footer switch configuration, to shut off certain circuitry or circuit segments during periods of operational inactivity. In comparison to surrounding transistors, such switch transistors are commonly very small. For example, a CMOS switch transistor may be somewhere on the order of $\frac{1}{100}^{th}$ the size of an associated circuit transistor. Such a reduction in size of a switch transistor proportionally reduces its current levels, especially leakage current levels. Thus, a device utilizing such a switch transistor can greatly reduce its off state leakage current—benefiting overall system power consumption.

Unfortunately, however, switch transistors can also introduce certain performance or reliability issues into a device or system design. Commonly, relatively small switch transistors have fast on/off transition times—typically much faster than larger device components in surrounding circuitry. When a switching transistor transitions too fast, it can cause signal instabilities (e.g., ringing, overshoot) in surrounding circuitry. Adding circuitry to slow down switch transition, or to compensate for resultant instabilities, can be cumbersome and costly. As previously noted, small switch transistors also have relatively small current levels. In certain applications, current limitations of a switch transistor can affect performance levels (e.g., drive current) in surrounding circuitry.

As a result, there is a need for a system that provides accurate and manageable control of signal transition times and drive current levels for a switch transistor—one that satisfies critical system performance and power-consumption requirements while providing reliable device operation in an easy, efficient and cost-effective manner.

SUMMARY OF THE INVENTION

The present invention provides a system for controlling signal transition times and drive current levels of a switch transistor. The present invention provides an accurate switch transistor control system that easily implemented, while adding nominal device layout or fabrication overhead. Switch transistors according to the present invention may be implemented in header, footer or header and footer configurations to minimize off state leakage current. Switch transistors according to the present invention provide stable transitions between off and on states, and provide increased on state drive current levels. The system of the present invention thus optimizes device performance, reliability and power-consumption in an easy, efficient and cost-effective manner—overcoming certain limitations associated with conventional approaches.

Specifically, the present invention provides a system that utilizes dynamic body biasing of a switch transistor. According to the present invention, a switch transistor is selectively biased during a transition between on and off states to render a desired transition time—sufficient to ensure signal stability in associated circuitry. Utilizing the present invention, circuitry may be designed to provide an optimal balance of transition time versus signal stability. At a selected interval after the transition, the switch transistor is selectively re-biased to provide a desired current throughput level for the associated circuitry. Switch transistors according to the present invention thus provide an optimal balance of device stability and performance.

More specifically, the present invention provides a system for controlling the performance of a switch transistor—one that is implemented within a semiconductor circuitry segment to shut off an operational circuitry component when that component is not in use. The switch transistor has a first terminal coupled to a first supply voltage, a second terminal coupled to an internal voltage rail, a gate coupled to an activation signal source, and a channel body or gate body coupled to a bias signal source. A bias signal, sufficient to induce a negative body bias across the switch transistor, is applied by the bias signal source when the switch transistor is shut off. A bias signal, sufficient to induce a negative body bias across the switch transistor, is applied by the bias signal source for a period of time following assertion of an activation signal from the activation signal source that turns the switch transistor on. A bias signal, sufficient to induce a positive body bias across the switch transistor, is applied by the bias signal source after the period of time.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which:

FIG. 1 is an illustration depicting one embodiment of a circuitry segment according to the present invention; and FIG. 2 is an illustration depicting a signal-timing scheme for one embodiment of a switch transistor system according to the present invention.

FIG. 3 is an illustration depicting one embodiment of circuitry capable of providing a body bias signal according to the present invention.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. Certain aspects of the present invention are described, for purposes of explanation and illustration, in conjunction with a system utilizing body bias of header or footer switch transistors implemented on standard CMOS wafers. Upon reference to the description of the present invention, however, it should be readily apparent that the principles and teachings of the present invention may be implemented with other device structures and technologies, where utilizing body bias in accordance with the present invention is feasible. For example, the structures and techniques described herein may also be applied to MOS transistors implemented in, for example, silicon over insulator (SOI) wafer technology. Therefore, the specific embodiments discussed herein are merely illustrative of specific ways to make and use the invention and do not limit the scope of the invention.

The system of the present invention provides dynamic control of signal transition times and drive current levels for a switch transistor. The switch transistor control system is highly accurate, and may be easily implemented in high-volume commercially viable process technologies with only a nominal increase in device layout or fabrication overhead. Switch transistors according to the present invention minimize off state leakage current, provide stable transitions between off and on states, and provide increased on state drive current levels. The system of the present invention thus optimizes device performance, reliability and power-consumption in an easy, efficient and cost-effective manner.

Specifically, the present invention provides a system that utilizes dynamic body biasing of a switch transistor to control signal transition times and drive current levels. According to the present invention, a switch transistor is selectively biased during a transition between on and off states to render a desired transition time. Depending upon the nature of the circuitry and signals associated with the switch transistor, the transition time is set to an amount sufficient to ensure stability of the associated circuitry and signals. This setting may be adjusted as needed or desired to provide an optimal balance of transition time versus signal stability. At a selected interval after the transition is complete, the switch transistor is selectively re-biased to a level selected to promote or provide a desired current throughput for the associated circuitry. Switch transistors according to the present invention thus provide an optimal balance of stability and performance on a device and application level.

Certain aspects of a system according to the present invention are described in greater detail now with reference to illustrative circuitry segment 100 as depicted in FIG. 1. Segment 100 comprises an upper supply voltage 102 ($V_{DD}$) and a lower supply voltage 104 ($V_{SS}$). A PMOS transistor 106 is provided in a header switch configuration, having a first terminal (i.e., its source) coupled to supply 102, and second terminal (i.e., its drain) coupled to a node 108. Node 108 represents an internal voltage rail ($V_{INT}$). An activation signal is transmitted through node 110, which is transmitted through a pre-drive or logic element 112 to a third terminal (i.e., the gate) of transistor 106. In alternative embodiments, node 110 may couple directly to the gate of transistor 106. The body (i.e., gate body or channel body) of transistor 106 is coupled to node 114. An operational circuitry component 116 is intercoupled between node 108 and supply 104. In alternative embodiments, transistor 106 may comprise an NMOS transistor provided as a footer switch transistor— where, generally, transistor 106 is coupled between supply 104 and node 108, and component 116 is coupled between supply 102 and node 108. Depending upon the wafer and process technologies used, other embodiments may comprise of NMOS transistors used in header configurations, or PMOS transistors used in footer configurations. All such variations, and combinations thereof, are comprehended by the present invention.

Functionally, component 116 comprises circuitry that is to be shut down when not in direct use. As mentioned above, transistor 106 is provided as an overhead switch transistor for component 116. Responsive to an appropriate signal at node 110, transistor 106 is in an off state and, correspondingly, shuts off node 108 and component 116 (the "off" state). Transistor 106 may have, relatively, very small transistor geometry when compared to adjacent transistors (e.g., ~$\frac{1}{100}^{th}$ the gate width). As a result, any leakage current from transistor 106 in the off state is either nominal or negligible.

As segment 100 transitions from an off state to an on state, a number of conditions or operations exist or occur. An appropriate transition signal is asserted at node 110—sufficient to change the gate voltage of transistor 106 such that it turns on. This, in turn, raises the internal rail voltage ($V_{INT}$) to some desired operational voltage (e.g., $V_{DD}$-$V_{SD\,(106)}$). As $V_{INT}$ shifts, component 116 turns on and begins operation. In a number of applications, two characteristics of these off and on state conditions and interactions are of particular concern: the transition time of transistor 106 from off to on state, which correlates to the transition time of component 116 from off to on state; and the current throughput capacity of transistor 106 when component 116 is active and operational.

Regarding the transition time from off to on state, a number of circuits are highly sensitive to fast signal swings. Without the benefit of the present invention, the transition of transistor 106 from off to on state can be practically instantaneous. This can induce a number of signal aberrations in component 106, such as inductive overshoot or ringing on the internal voltage supply node 108. Depending upon the application that segment 100 is utilized in, such signal aberrations may significantly degrade system performance or reliability. Current throughput of transistor 106 in the on state can also negatively impact system performance. Without the aid of the present invention, transistor 106 has a relatively limited current throughput capacity due to its relatively small size. While its small size is useful in reducing leakage current during the off state, the transistor has the same limiting effect on operational current during the on state.

According to the present invention, however, transistor 106 is selectively or dynamically body biased, via node 114, to slow off/on transition times—eliminating signal aberrations commonly associated with fast transitions—and to provide increased current throughput (i.e., increase drive at node 108) during the on state. During an off state, an appropriate charge is applied to node 114 sufficient to induce a negative body bias across transistor 106 (i.e., $V_{(114)} > V_{DD}$). This negative body bias decreases carrier density in the channel of transistor 106, slowing its transition from off to on. Thus, upon assertion of an appropriate signal at node 110, transistor 106 begins to transition from off state to on state. During the transition, the negative body bias is maintained across transistor 106 for a desired amount of time sufficient to ensure stable signal transition for node 108. This amount of time may be referred to as a bias delay period.

Without the aid of the present invention, additional circuitry could be implemented in relation to transistor 106 (e.g., coupled to the gate thereof) to slow its transition from off to on state. In many cases, such circuitry would be non-trivial and introduce some amount of unnecessary overhead into the circuit design. In contrast, circuitry according to the present invention requires only a contact for applying a body bias to transistor 106—providing transition control with optimal efficiency.

In certain embodiments, the magnitude of the negative body bias may be increased during the transition from off state to on state. For example, in such an embodiment, where body bias during off state is equal to $1.5(V_{DD})$, the body bias during the bias delay period may be increased to $2(V_{DD})$. Generally, a larger magnitude of negative body bias will result in a slower transition time and an increased bias delay period. Depending upon the particular embodiment, an appropriate body bias may be selected to slow signal transition to match a desired or predetermined delay period. In other embodiments, however, a limited number of voltage sources appropriate for inducing a negative body bias may militate a limited range of delay periods.

Once a stable off to on transition is complete, or once a predetermined delay period has ended, a number of actions may be taken. A negative body bias could be maintained during the on state—although in most cases this could decrease performance (i.e., current throughput) and increase the likelihood of deterioration of transistor 106. In certain embodiments, the body bias may be eliminated (i.e., adjusted back to $\sim V_{DD}$ from a higher value).

In still other embodiments, an appropriate charge is applied to node 114 sufficient to induce a positive body bias across transistor 106 (i.e., $V_{(114)} \leq V_{DD}$), increasing drive level(s) at node 108. For example, in certain embodiments, where body bias during off state is equal to $1.5(V_{DD})$, body bias during the on state may be $0.5(V_{DD})$. In such embodiments, a positive body bias improves current throughput by increasing carrier density in the channel of transistor 106. This, in turn, increases drive level(s) at node 108—improving the overall on state performance of segment 100. In such embodiments, a positive body bias is maintained throughout the on state.

Certain aspects of the present invention as related above are described now in greater details with reference to FIG. 2, which depicts timing diagram 200 relating representative signal levels and timing of a transition from off to on state for one embodiment of the present invention (e.g., one embodiment of segment 100). Diagram 200 comprises three plots: plot 202, which represents an activation signal (e.g., node 110); plot 204, which represents a body bias signal (e.g., node 114); and plot 206, which represents an internal voltage rail signal (e.g., node 108). During an initial period 208, which represents an off state, signal 202 is low (0), signal 204 is held at an initial negative body bias level (e.g., $1.5\ V_{DD}$), and the internal voltage rail is low (0). Signal 202 is asserted high (e.g., $V_{DD}$) to initiate a transition from the off state to an on state. This begins transition period 210.

Upon the initiation of period 210, signal 204 is increased from its initial negative body bias level to a secondary negative body bias level (e.g., $2\ V_{DD}$). Any suitable circuitry may be used to source the body bias voltage signal to node 114, such as the example circuitry shown in FIG. 3 (where $V_{PP}$ is a voltage that is more positive than $V_{DD}$). However, other circuitry capable of providing the body bias signal is known in the art and comprehended by this embodiment. Signal 206 gradually shifts from its off state level to an on state level (e.g., $V_{DD}$), ending transition period 210. Signal 204 may be maintained at its secondary level for a brief delay period 212, before it is decreased from its secondary negative body bias level to a positive body bias level (e.g., $0.5\ V_{DD}$). Delay period 212 is of a length sufficient to ensure stability of signal 206 at its on level. Depending upon the embodiment, period 212 may be nominal or eliminated altogether. Where delay 212 is non-zero, signal 204 is maintained at a negative body bias level for a total period of time 214 (i.e., the bias delay period), which is equal to the sum of intervals 210 and 212.

Depending upon the circuitry and signals involved, a number of variations in accordance with the present invention are possible. For example, signal 204 may be maintained at its initial negative body bias level throughout period 214, instead of being increased at the start of period 210. At the end of period 214, signal 204 may be decreased to 0V instead of ($0.5\ V_{DD}$), depending upon the desired current throughput level(s) at the internal voltage rail. These and a number of other variations and combinations are comprehended by the present invention.

Thus, by the present invention, body bias voltage is applied and dynamically adjusted to achieve desired performance and behavioral characteristics for a switch transistor. A switch transistor is appropriately biased to decrease channel carrier levels, slowing its transition from an off to an on state. That transistor may be further biased to subsequently increase channel carrier levels, increasing current throughput of the transistor during its on state. The present invention provides designers with the ability to tune the transition time/signal stability performance of a circuit utilizing a switch transistor. For example, if a minimal amount of ringing is acceptable on signal 206, signal 202 may be reduced to decrease the transition interval 210. If greater stability for signal 206 is required, a longer transition time 210 may be supplied by increasing the body bias applied by signal 202.

As previously discussed, the embodiments and examples set forth herein are therefore presented to best explain the present invention and its practical application, and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. As indicated, a number of modifications and variations are possible in light of the above teaching without departing from the spirit and scope of the following claims.

What is claimed is:

1. A method for controlling performance of a switch transistor, the method comprising the steps of:
   providing the switch transistor, having a channel, a first terminal coupled to a first supply voltage, a second terminal coupled to an internal voltage rail, a gate coupled to an activation signal source, and a body coupled to a bias signal;
   providing the bias signal having a first voltage level sufficient to induce a negative body bias across the channel of the switch transistor when that transistor is shut off;
   providing the bias signal having a second voltage level sufficient to induce a negative body bias across the channel of the switch transistor for a period of time following assertion of an activation signal from the activation signal source that turns the switch transistor on; and
   providing the bias signal having a third voltage level sufficient to induce a positive body bias across the channel of the switch transistor after the period of time.

2. The method of claim 1, wherein the step of providing a switch transistor further comprises providing a PMOS switch transistor, having its source coupled to the first supply voltage and its drain coupled to the internal voltage rail.

3. The method of claim 1, wherein the step of providing a switch transistor further comprises providing an NMOS switch transistor, having its drain coupled to the first supply voltage and its source coupled to the internal voltage rail.

4. The method of claim 1, wherein the step of providing a bias signal of a first voltage level sufficient to induce a negative body bias across the switch transistor when that transistor is shut off further comprises providing a bias signal having a magnitude greater than the first supply voltage.

5. The method of claim 1, wherein the step of providing a bias signal of a second voltage level sufficient to induce a negative body bias across the switch transistor for a period of time following assertion of an activation signal from the activation signal source that turns the switch transistor on further comprises providing a bias signal having a magnitude greater than the first supply voltage.

6. The method of claim 1, wherein the step of providing a bias signal of a second voltage level sufficient to induce a negative body bias across the switch transistor for a period of time following assertion of an activation signal from the activation signal source that turns the switch transistor on further comprises providing a bias signal having a magnitude greater than the bias signal sufficient to induce a negative body bias across the switch transistor when that transistor is shut off.

7. The method of claim 1, wherein the step of providing a bias signal of a third voltage level sufficient to induce a positive body bias across the switch transistor after the period of time further comprises providing a bias signal having a magnitude equal to the first supply voltage.

8. The method of claim 1, wherein the step of providing a bias signal of a third voltage level sufficient to induce a positive body bias across the switch transistor after the period of time further comprises providing a bias signal having a magnitude less than the first supply voltage.

9. The method of claim 1, wherein the step of providing a bias signal of a third voltage level sufficient to induce a positive body bias across the switch transistor after the period of time further comprises providing a body bias of zero volts.

10. The method of claim 1, wherein the step of providing a bias signal of a second voltage level sufficient to induce a negative body bias across the switch transistor for a period of time further comprises providing a bias signal sufficient to induce a negative body bias across the switch transistor for a period of time sufficient to ensure a stable transition of the internal voltage rail.

11. The method of claim 1, wherein the step of providing a bias signal of a third voltage level sufficient to induce a positive body bias across the switch transistor after the period of time occurs immediately after the period of time.

12. The method of claim 1, wherein the step of providing a bias signal of a third voltage level sufficient to induce a positive body bias across the transistor after the period of time occurs after a delay interval immediately following the period of time.

13. A semiconductor circuitry segment comprising:
    a switch transistor, having a channel, a first terminal coupled to a first supply voltage, a second terminal coupled to an internal voltage rail, a gate coupled to an activation signal source, and a body coupled to a bias signal source; wherein
    the bias signal source having a first voltage level induces a negative body bias across the channel of the switch transistor when the switch transistor is shut off;
    the bias signal source having a second voltage level induces a negative body bias across the channel of the switch transistor for a period of time following assertion of an activation signal from the activation signal source that turns the switch transistor on; and
    the bias signal source induces a positive body bias across the channel of the switch transistor after the period of time.

14. The circuitry segment of claim 13, wherein the switch transistor further comprises a PMOS switch transistor, having its source coupled to the first supply voltage and its drain coupled to the internal voltage rail.

15. The circuitry segment of claim 13, wherein the switch transistor further comprises an NMOS switch transistor, having its drain coupled to the first supply voltage and its source coupled to the internal voltage rail.

16. The circuitry segment of claim 13, wherein negative body bias across the switch transistor for a period of time following assertion of an activation signal is induced when the bias signal source having the second voltage level has a magnitude greater than the first supply voltage.

17. The circuitry segment of claim 13, wherein negative body bias across the switch transistor for a period of time following assertion of an activation signal is induced when the bias signal source having the second voltage level has a magnitude greater than the voltage sufficient to induce a negative body bias across the switch transistor when that transistor is shut off.

18. The circuitry segment of claim 13, wherein the positive body bias across the switch transistor is induced when the bias signal source has a magnitude less than the first supply voltage.

19. The circuitry segment of claim 13, wherein the positive body bias across the switch transistor is induced when the bias signal source is zero volts.

* * * * *